United States Patent
Kawae

(10) Patent No.: US 7,502,040 B2
(45) Date of Patent: Mar. 10, 2009

(54) DISPLAY DEVICE, DRIVING METHOD THEREOF AND ELECTRONIC APPLIANCE

(75) Inventor: Daisuke Kawae, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 640 days.

(21) Appl. No.: 11/288,696

(22) Filed: Nov. 29, 2005

(65) Prior Publication Data

US 2006/0119554 A1 Jun. 8, 2006

(30) Foreign Application Priority Data

Dec. 6, 2004 (JP) .............................. 2004-353454

(51) Int. Cl.
G09G 5/00 (2006.01)
(52) U.S. Cl. ..................................... 345/690
(58) Field of Classification Search ............. 345/76–79, 345/690–694
See application file for complete search history.

(56) References Cited

U.S. PATENT DOCUMENTS

| | | | |
|---|---|---|---|
| 4,070,663 A | 1/1978 | Kanatani et al. | 340/324 |
| 4,773,738 A | 9/1988 | Hayakawa et al. | 350/350 |
| 5,091,722 A | 2/1992 | Kitajima et al. | 340/784 |
| 5,189,406 A | 2/1993 | Humphries et al. | 340/793 |
| 5,200,846 A | 4/1993 | Hiroki et al. | 359/57 |
| 5,225,823 A | 7/1993 | Kanaly | 340/793 |
| 5,302,966 A | 4/1994 | Stewart | 345/76 |
| 5,349,366 A | 9/1994 | Yamazaki et al. | 345/92 |
| 5,414,442 A | 5/1995 | Yamazaki et al. | 345/89 |
| 5,424,752 A | 6/1995 | Yamazaki et al. | 345/92 |
| 5,471,225 A | 11/1995 | Parks | 345/98 |
| 5,479,283 A | 12/1995 | Kaneko et al. | 359/79 |
| 5,583,534 A | 12/1996 | Katakura et al. | 345/97 |
| 5,600,169 A | 2/1997 | Burgener et al. | 257/352 |
| 5,627,560 A * | 5/1997 | Verhulst | 345/97 |

(Continued)

FOREIGN PATENT DOCUMENTS

EP 0 831 449 A2 3/1998

(Continued)

OTHER PUBLICATIONS

Inukai, K. et al, "4.0-in. TFT-OLED Displays and a Novel Digital Driving Method," SID International Symposium Digest of Technical Papers, SID '00 Digest, pp. 924-927 (2000).

*Primary Examiner*—Richard Hjerpe
*Assistant Examiner*—Nelson Lam
(74) *Attorney, Agent, or Firm*—Cook Alex Ltd.

(57) ABSTRACT

A driving method of a display device for expressing gray scales by a time gray scale method is provided where one frame is divided into multiple sub-frames, so that both the aperture ratio and the duty ratio can be maintained high while the power consumption can be suppressed low. The order of sub-frames is set to be different for each group having multiple pixel rows, and a data writing period of each group having the multiple pixel rows is set to be shorter than a data holding period of a sub-frame which corresponds to the least significant bit. While pixel rows belonging to a certain group are scanned, pixel rows belonging to the other groups are all in the data holding period. Accordingly, the driving frequency of data lines can be suppressed low and the power consumption can be reduced.

33 Claims, 11 Drawing Sheets

U.S. PATENT DOCUMENTS

| | | | |
|---|---|---|---|
| 5,642,129 A | 6/1997 | Zavracky et al. | 345/100 |
| 5,712,652 A | 1/1998 | Sato et al. | 345/90 |
| 5,767,828 A | 6/1998 | McKnight | 345/89 |
| 5,798,746 A | 8/1998 | Koyama | 345/98 |
| 5,926,160 A * | 7/1999 | Furuya | 345/98 |
| 5,969,710 A | 10/1999 | Doherty et al. | 345/148 |
| 5,986,640 A | 11/1999 | Baldwin et al. | 345/147 |
| 5,990,629 A | 11/1999 | Yamada et al. | 315/169.3 |
| 6,034,659 A | 3/2000 | Wald et al. | 345/76 |
| 6,040,819 A | 3/2000 | Someya | 345/147 |
| 6,091,203 A | 7/2000 | Kawashima et al. | 315/169.3 |
| 6,157,356 A | 12/2000 | Troutman | 345/82 |
| 6,215,466 B1 | 4/2001 | Yamazaki et al. | 345/89 |
| 6,222,512 B1 | 4/2001 | Tajima et al. | 345/63 |
| 6,229,506 B1 | 5/2001 | Dawson et al. | 345/82 |
| 6,229,508 B1 | 5/2001 | Kane | 345/82 |
| 6,249,265 B1 | 6/2001 | Tajima et al. | 345/63 |
| 6,310,594 B1 * | 10/2001 | Libsch et al. | 345/90 |
| 6,373,454 B1 | 4/2002 | Knapp et al. | 345/76 |
| 6,452,341 B1 | 9/2002 | Yamauchi et al. | 315/169.1 |
| 6,518,977 B1 | 2/2003 | Naka et al. | 345/690 |
| 6,542,138 B1 | 4/2003 | Shannon et al. | 345/76 |
| 6,563,480 B1 | 5/2003 | Nakamura | 345/82 |
| 6,778,152 B1 | 8/2004 | Huang | 345/60 |
| 6,924,824 B2 * | 8/2005 | Adachi et al. | 345/690 |
| 7,242,378 B2 * | 7/2007 | Okabe et al. | 345/77 |
| 7,286,105 B2 * | 10/2007 | Akimoto et al. | 345/82 |
| 2001/0038367 A1 | 11/2001 | Inukai | 345/76 |
| 2002/0047852 A1 | 4/2002 | Inukai et al. | 345/629 |
| 2003/0011314 A1 | 1/2003 | Numao | 315/169.3 |
| 2003/0025656 A1 | 2/2003 | Kimura | 345/82 |
| 2003/0057423 A1 | 3/2003 | Shimoda et al. | 257/80 |
| 2003/0058195 A1 | 3/2003 | Adachi et al. | 345/67 |
| 2003/0197664 A1 * | 10/2003 | Koyama | 345/76 |
| 2004/0032403 A1 * | 2/2004 | Sala et al. | 345/204 |
| 2004/0196304 A1 * | 10/2004 | Lee et al. | 345/690 |

FOREIGN PATENT DOCUMENTS

| | | |
|---|---|---|
| EP | 0 838 799 A1 | 4/1998 |
| EP | 1 184 833 A2 | 3/2002 |
| EP | 1 187 087 | 3/2002 |
| JP | 07-175439 | 7/1995 |
| JP | 09-034399 | 2/1997 |
| JP | 09-172589 | 6/1997 |
| JP | 10-171401 | 6/1998 |
| JP | 2853998 | 2/1999 |
| JP | 2002-032057 | 1/2002 |
| JP | 2002-175047 | 6/2002 |
| JP | 2003-208126 | 7/2003 |
| WO | WO 99/60557 | 11/1999 |
| WO | WO 99/65012 | 12/1999 |
| WO | WO 01/52229 | 7/2001 |

* cited by examiner

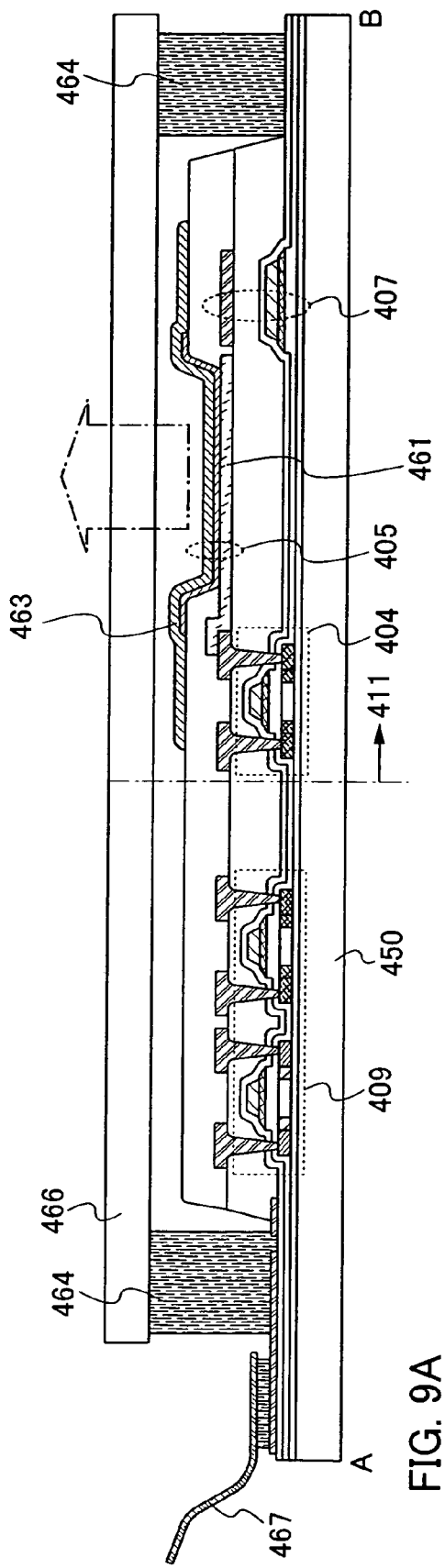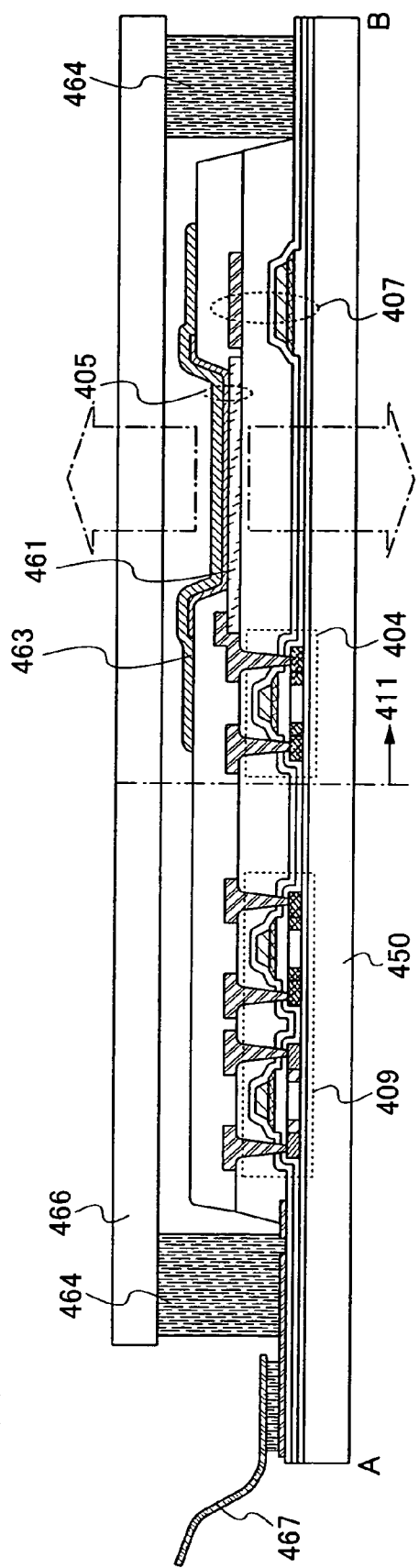

DISPLAY DEVICE, DRIVING METHOD THEREOF AND ELECTRONIC APPLIANCE

BACKGROUND OF THE INVENTION

1. Field of the Invention

The present invention relates to an active matrix display device and a driving method thereof. In addition, the invention relates to an electronic appliance having the display device as a display portion.

2. Description of the Related Art

In order to perform multi-gray scale display using display elements, gray scales are required to be expressed by appropriately controlling the elements by means of a physical value. For example, if a liquid crystal element is used as the display element, gray scales are expressed by applying an analog voltage to the element. On the other hand, if an organic EL element is used as the display element, gray scales are expressed by supplying an analog current to the organic EL element. However, methods utilizing an analog value have limitations on the display accuracy. In particular, in an active matrix display device using organic EL elements which have been actively developed in recent years, analog current values supplied to the EL elements are controlled with TFTs; therefore, variations in the TFT characteristics directly affect the display characteristics.

Meanwhile, a method utilizing the time as a physical value for expressing gray scales is proposed, in which gray scales are expressed using a pulse-width modulation. Specifically, this is a method for expressing gray scales by using the light-emission time of an electro-optical element. In this method, the electro-optical element has only two states of the light-emission and non-light-emission. Therefore, this method does not involve a problem on the display accuracy unlike the case of controlling the light emission state with an analog voltage or an analog current. As for the light-emission time also, if gray scales are expressed by using a discrete value such as an integral multiple of a predetermined unit time, the electro-optical element can be driven without using analog values.

When implementing the aforementioned method, typically, data on a gray scale is expressed with a binary code, and a sub-frame composed of a data writing period and a data holding period is provided for each digit in such a manner that the data holding period for each digit is set to have a proportionate length to a weighted value of the digit. By sequentially displaying each sub-frame, one frame is formed, and gray scales are expressed by using an integral value of the light-emission time in one frame period. This method requires only n data writing operations for expressing a gray scale of $2^n$; therefore, it is efficient (hereinafter, this method is called a digital time gray scale method).

Meanwhile, in an active matrix display device, the whole pixels for forming one image screen are divided into multiple groups, and data writing is performed in parallel for the pixels within one group while data writing is sequentially performed for each group in a time division manner. Conventionally, a common scan line is provided for each pixel row and a common data line is provided for each pixel column so that data is written to the pixels in the same row in parallel in a time division manner, that is a line sequential driving method has been adopted.

[Non-patent Document 1] K. Inukai, et al., "4.0-in. TFT-OLED Displays and a Novel Digital Driving Method", SID Dig. Tech. Papers, pp. 924-927, May 2000

[Patent Document 1] Japanese Patent Laid-Open No. 2002-32057

[Patent Document 2] Japanese Patent Laid-Open No. 2002-175047

[Patent Document 3] Japanese Patent No. 2853998

[Patent Document 4] PCT WO01/52229

[Patent Document 5] Japanese Patent Laid-Open No. 2003-208126

There is a case that a contradiction occurs when combining a digital time gray scale method and a line sequential driving method in an active matrix display device. That is, since both of the digital time gray scale method and the line sequential driving method are performed in a time division manner by utilizing the time axis, there is a case that it is difficult to keep the predetermined writing order without contradiction. More specifically, if the time required for the data writing to the whole pixel rows is longer than a data holding period of a sub-frame corresponding to a low-order digit which is weighted into a small value (namely, the shortest sub-frame period), it is required that multiple pixel rows be scanned simultaneously.

As a means for solving the problem, such a method is proposed that a reset function be provided in addition to the normal scan and writing functions, and a non-light-emission period be provided after a sub-frame having the shortest data holding period so that the next sub-frame is started after completing the data writing operation in the present sub-frame (see Non-patent Document 1). However, this method has a problem in that an additional circuit is required in the pixel, which decreases the aperture ratio. Patent Document 1 and Patent Document 2 disclose alternative methods for achieving the aforementioned reset operation without providing an additional circuit in the pixel; however, both have a problem in that the ratio of the light-emission time relatively to a frame period (duty ratio) is decreased by providing the non-light-emission period.

Meanwhile, Patent Document 3 and Patent Document 4 disclose methods for maintaining the duty ratio high without performing the reset operation. In these methods, the time required for data writing to one pixel row is divided into multiple sub-periods, and data writing is performed to different pixel rows in each sub-period, thereby multiple pixel rows are simultaneously scanned spuriously. However, such methods have a problem in that the power consumption is increased since the driving frequency of data lines is increased. In addition, as disclosed in Patent Document 5, there is another problem in that the ratio of the data holding period for each digit cannot be exactly equal to the ratio of a weighted value of each digit.

SUMMARY OF THE INVENTION

The invention is made in view of the foregoing problems, and it is a primary object of the invention to provide a driving method of a display device with a high aperture ratio in which a high duty ratio is maintained while the power consumption is suppressed.

The aforementioned problem derives from the fact that there is a case where the time required for data writing to the whole pixel rows is longer than a data holding period of a sub-frame corresponding to the least significant bit (LSB). Therefore, in the invention, a pixel array is divided into multiple groups on the row basis, and in the data writing operation, not the whole pixel rows are scanned but only one group is scanned so that the time required for the data writing to each group can be shorter than a data holding period of a sub-frame corresponding to the LSB. Furthermore, by setting the order of sub-frames for each group to be different from each other, such a circumstance can be avoided where multiple pixel rows are required to be scanned simultaneously. More specifically, the invention provides a driving method of an active matrix display device having a pixel array of x columns and y rows, where one frame is composed of multiple sub-frames, and each sub-frame is composed of a data writing period and a data holding period which maintains the light-emission state or the non-light-emission state in accordance with the written data. Given that the time required for the data writing to one pixel row is Twrite while the shortest data holding period is Thold, each pixel row of the pixel array having a total of y pixel rows belongs to one of j groups which satisfy Twrite×y/j=Thold, and the order of the sub-frames is different in each group. In addition, pixel rows belonging to the same group are scanned in time sequence, and in the period in which pixel rows belonging to a certain group are scanned, pixel rows belonging to the other groups are all in the data holding period.

That is, according to a display device of the invention, gray scales are expressed by dividing one frame into multiple sub-frames. The display device includes a pixel array where pixels are arranged in matrix, and the pixel array has multiple groups each of which is composed of multiple pixel rows having the same order of sub-frames. Thus, the order of the sub-frames is different in each group.

According to a driving method of a display device of the invention, gray scales are expressed by dividing one frame into multiple sub-frames, and the order of the sub-frames is different in each group having multiple pixel rows.

According to another driving method of a display device of the invention, gray scales are expressed by dividing one frame into multiple sub-frames, and the order of the sub-frames is different in each group having multiple pixel rows. A data writing period of each group having the multiple pixel rows is shorter than a data holding period of a sub-frame corresponding to the least significant bit.

The driving method of the invention is a driving method of a display device having a pixel array of x columns and y rows where gray scales are expressed by dividing one frame into multiple sub-frames. Given that the time required for the data writing to one pixel row is Twrite while a data holding period of a sub-frame corresponding to the least significant bit is Thold, the order of the sub-frames is different in each of j groups composed of multiple pixel rows which satisfy Twrite×y/j=Thold.

According to the aforementioned structure of the driving method of a display device of the invention, the pixel rows belonging to the same group are scanned in time sequence for signal writing while pixel rows belonging to the other groups are all in the data holding period.

According to the invention, in performing a digital time gray scale method in an active matrix display device, a reset operation is not required; therefore, both the aperture ratio and the duty ratio can be maintained high while the driving frequency of data lines can be suppressed low. Thus, the power consumption can be suppressed as compared to the conventional technology.

BRIEF DESCRIPTION OF THE DRAWINGS

FIGS. 9A and 9B illustrate structures of a panel in accordance with the invention.

DETAILED DESCRIPTION OF THE INVENTION

Figure 1:
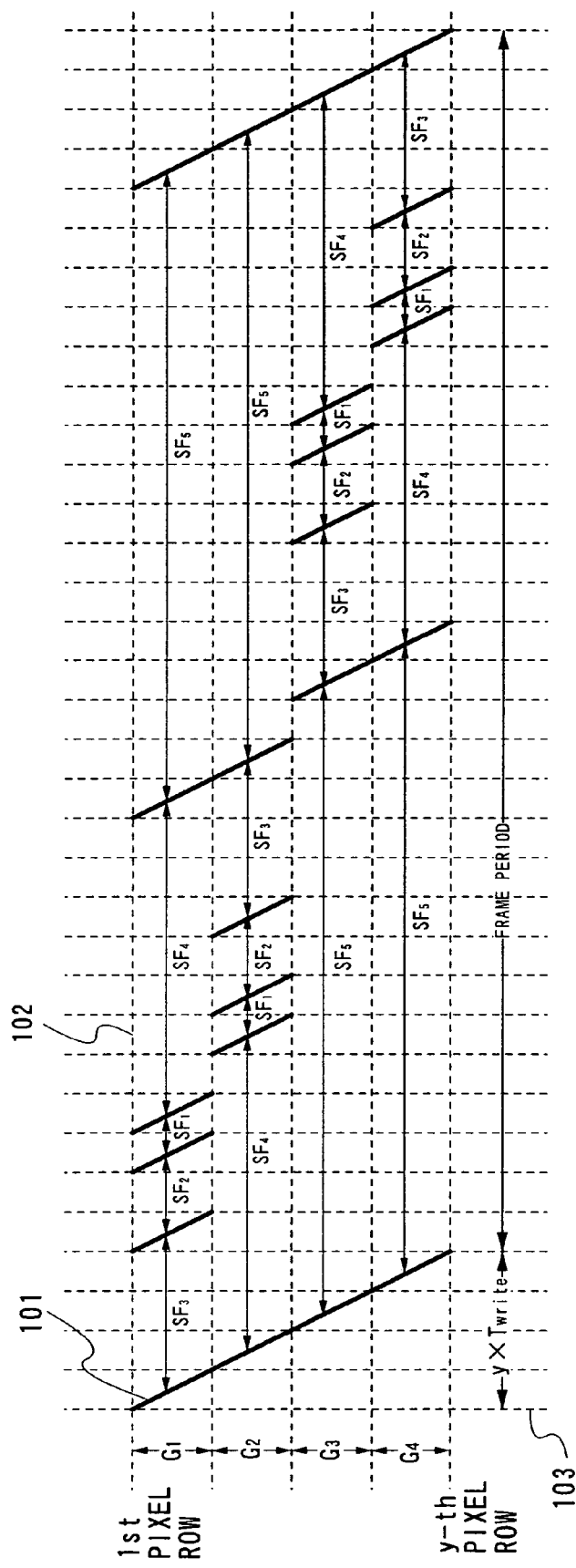
FIG. 1 is a timing chart illustrating one example of a driving method of the invention.

Although the invention will be fully described by way of embodiment mode and embodiments with reference to the accompanying drawings, it is to be understood that various changes and modifications will be apparent to those skilled in the art. Therefore, unless otherwise such changes and modifications depart from the scope of the invention, they should be construed as being included therein.

Description is made on the case where a gray scale of $2^n$ is expressed in an active matrix display device having a pixel array of x columns and y rows.

In this embodiment mode, each pixel row of the pixel array having a total of y pixel rows belongs to one of j groups which satisfy Twrite×y/j=Thold.

Note that $j=2^i$ (i is a natural number which satisfies $1 \leq i \leq (n-1)/2$).

Note also that the description is made below on the assumption that the number of pixel rows included in each group is y/j, which is equal among each group; however, the same logic applies to the case where the number of pixel rows included in each group is not equal to each other as long as a maximum value k of the number of pixel rows satisfies Twrite×k=Thold.

Data on a gray scale is expressed with a binary code, and a sub-frame composed of a data writing period and a data holding period is provided for each digit in such a manner that the data holding period for each digit is set to have a proportionate length to a weighted value of the digit. Each sub-frame SFp (p denotes a corresponding digit, and $1 \leq p \leq n$ is satisfied where the LSB is 1 and the MSB (Most Significant Bit) is n) is sequentially displayed so as to form one frame.

Here, the order of sub-frames for each group differs from each other, which is one feature of the invention. Description is made below on a procedure for determining the order of sub-frames.

First, groups Gq (q denotes data for distinguishing each group, and $1 \leq q \leq j$) among the total of j groups are arranged in order from a smaller value of q. In groups belonging to the first half of the order (G1, G2, ..., G(j/2)), SFn is set as the n-th sub-frame while in groups belonging to the second half of the order (G((j/2)+1), G((j/2)+2), ..., Gj), SFn is set as the first sub-frame.

Then, each group belonging to the first half of the order (G1, G2, ..., G(j/2)) is further divided in half, and in the first group thereof (G1, G2, ..., G(j/4)), SF(n−1) is set as the (n−1)-th sub-frame. Meanwhile, in the second group thereof (G((j/4)+1), G((j/4)+2), ..., G(j/2)), SF(n−1) is set as the first sub-frame. Similarly, each group belonging to the second half of the order (G((j/2)+1), G((j/2)+2), ..., Gj) is further divided in half, and in the first group thereof (G((j/2)+1), G((j/2)+2), ..., G(3j/4)), SF(n−1) is set as the n-th sub-frame. Meanwhile, in the second group thereof (G((3j/4)+1), G((3j/4)+2), ..., Gj), SF(n−1) is set as the second sub-frame.

Hereinafter, a similar procedure is repeated i times. In the i-th step, all the groups (G1, G2, ..., Gj) are divided into $2^i=j$ groups, and the order of sub-frames is set for the respective groups Gq.

At this time, the order of the sub-frames for i digits is determined through i steps; therefore, the order of (n−i) sub-frames remain to be determined for each group. If the identifier q assigned to a group is an odd number, (SF(n−i), SF(n−i−1), ..., SF1 are arranged in this order. On the other hand, if the q is an even number, SF1, SF2, ..., SF(n−i) are arranged in this order.

By using the pixel array composed of the groups G1, G2, ..., Gj for which the order of the sub-frames is determined in the aforementioned manner, gray scale display is performed.

FIG. 1 shows an example of a timing chart of one frame where the number of pixel rows is y, the number of gray scales is $2^n=32$ and the number of groups is j=4. The abscissa indicates time while the ordinate indicates scanned pixel rows, and a solid oblique line 101 indicates the timing of the data writing operation for the scanned pixel rows. Note that, for simplicity, the time required for scanning one group, namely (y/4) pixel rows: Twrite×(y/4) is set equal to the shortest data holding period Thold in SF1.

Two of five dashed lines 102 extending in the lateral direction denote the first pixel row and the y-th pixel row respectively on the top side and the bottom side, and the middle pixel rows are omitted. The three other dashed lines indicate the boundary between each group, which indicate that all the y pixel rows are divided into four groups G1, G2, G3 and G4, and the order of sub-frames is different in each group. Note that the ordinate in FIG. 1 is not necessarily required to correspond to the physical position in the pixel array. In other words, pixel rows belonging to the same group are not required to be located in physically continuous positions in the pixel array. What is important is that the pixel rows belonging to the same group are scanned in time sequence, and the ordered groups are scanned from a start point of each frame in accordance with the proper order.

As can be easily understood by referring to a number of solid lines 103 extending in the longitudinal direction, one or less pixel row is scanned at arbitrary time. Accordingly, the invention can prevent a circumstance where multiple pixel rows are required to be scanned simultaneously.

As set forth above, the division number of the pixel array having the total of y pixel rows is limited to $j=2^i$ in this embodiment mode, which is a preferable mode to be applied to any other cases as long as i=(n−1)/2 is satisfied. However, the invention is not limited to $j=2^i$, and it is to be easily understood by those skilled in the art that the division number can be set to an arbitrary integer, and the order of sub-frames for each divided group can be determined in various other modes. Accordingly, the invention is not limited to the description of this embodiment mode.

EMBODIMENT 1

This embodiment illustrates a configuration example of an active matrix display device of the invention and an example of an electronic appliance having the display device as a display portion.

Figure 2:
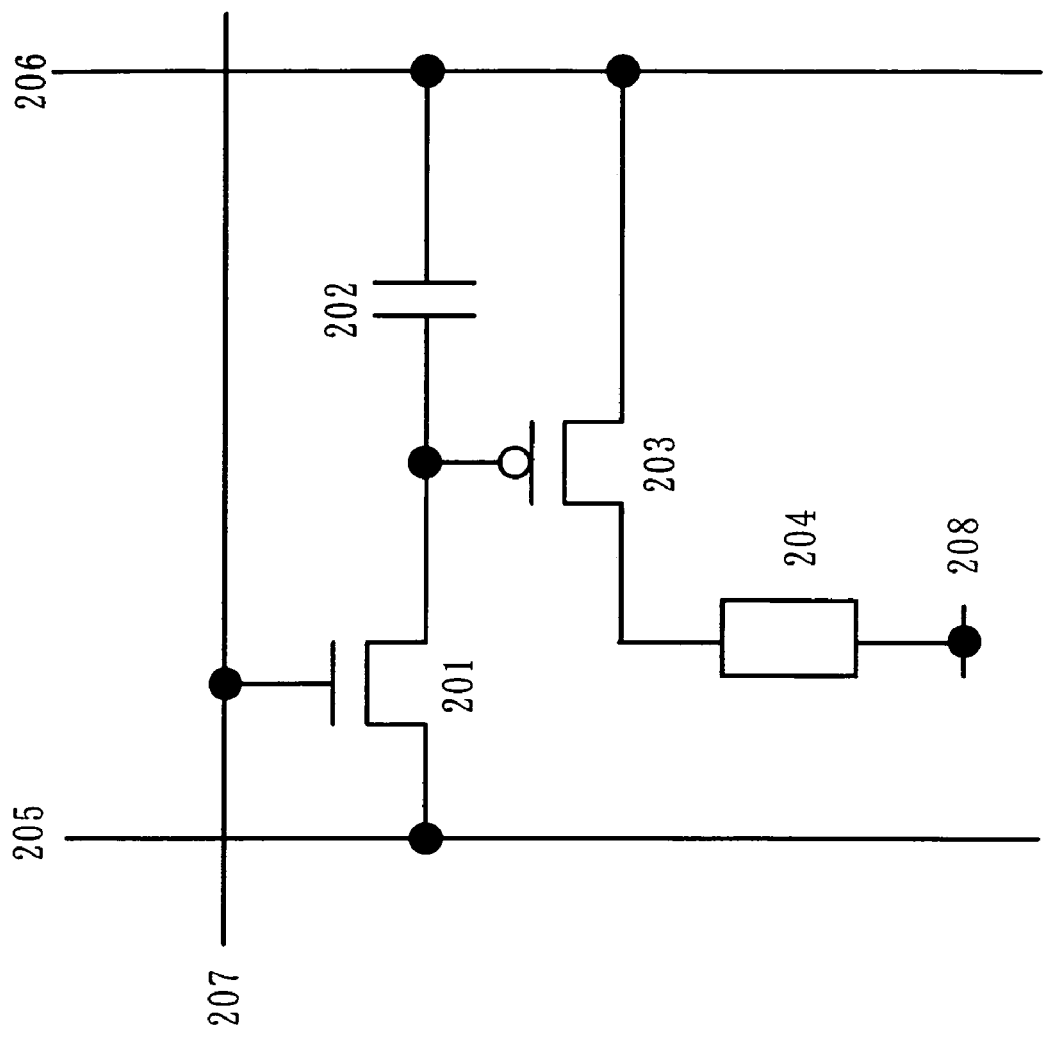
FIG. 2 illustrates a pixel configuration shown in Embodiment 1.

FIG. 2 shows a configuration example of a pixel. The pixel includes a switching transistor 201, a capacitor 202, a driving transistor 203, a display element 204, a data line 205, a power source line 206 and a scan line 207.

A gate terminal of the switching transistor 201 is connected to the scan line 207 and a first terminal (source terminal or drain terminal) thereof is connected to the data line 205 while a second terminal thereof (source terminal or drain terminal) thereof is connected to the power source line 206 through a gate terminal of the driving transistor 203 and the capacitor 202. A first terminal (source terminal or drain terminal) of the driving transistor 203 is connected to the power source line 206 while a second terminal (source terminal or drain terminal) thereof is connected to an anode of the display element 204. Note that a cathode of the display element 204 is connected to a wire 208 set at a low power source potential Vss. Note also that Vss is a potential which satisfies Vdd>Vss on the basis of a power source potential Vdd which is set to the power source line 206 for supplying a current to the display element 204 during a light-emission period.

Next, description is made on the operation of the pixel.

When the scan line 207 is selected, the switching transistor 201 is turned on and a signal is inputted to the capacitor 202 from the data line 205. In accordance with the signal, on/off of the driving transistor 203 is controlled. When the driving transistor 203 is on, a current flows from the power source line 206 to the wire 208 through the driving transistor 203 and the display element 204. On the other hand, when the driving transistor 203 is off, no current flows through the driving transistor 203. That is, no current flows into the display element 204. Accordingly, the display element 204 can be controlled to emit light or no light with a signal from the data line 205. This state can be maintained by holding the signal from the data line 205 in the capacitor 202 in a data holding period.

Next, description is made on a configuration of a display device.

Figure 3:
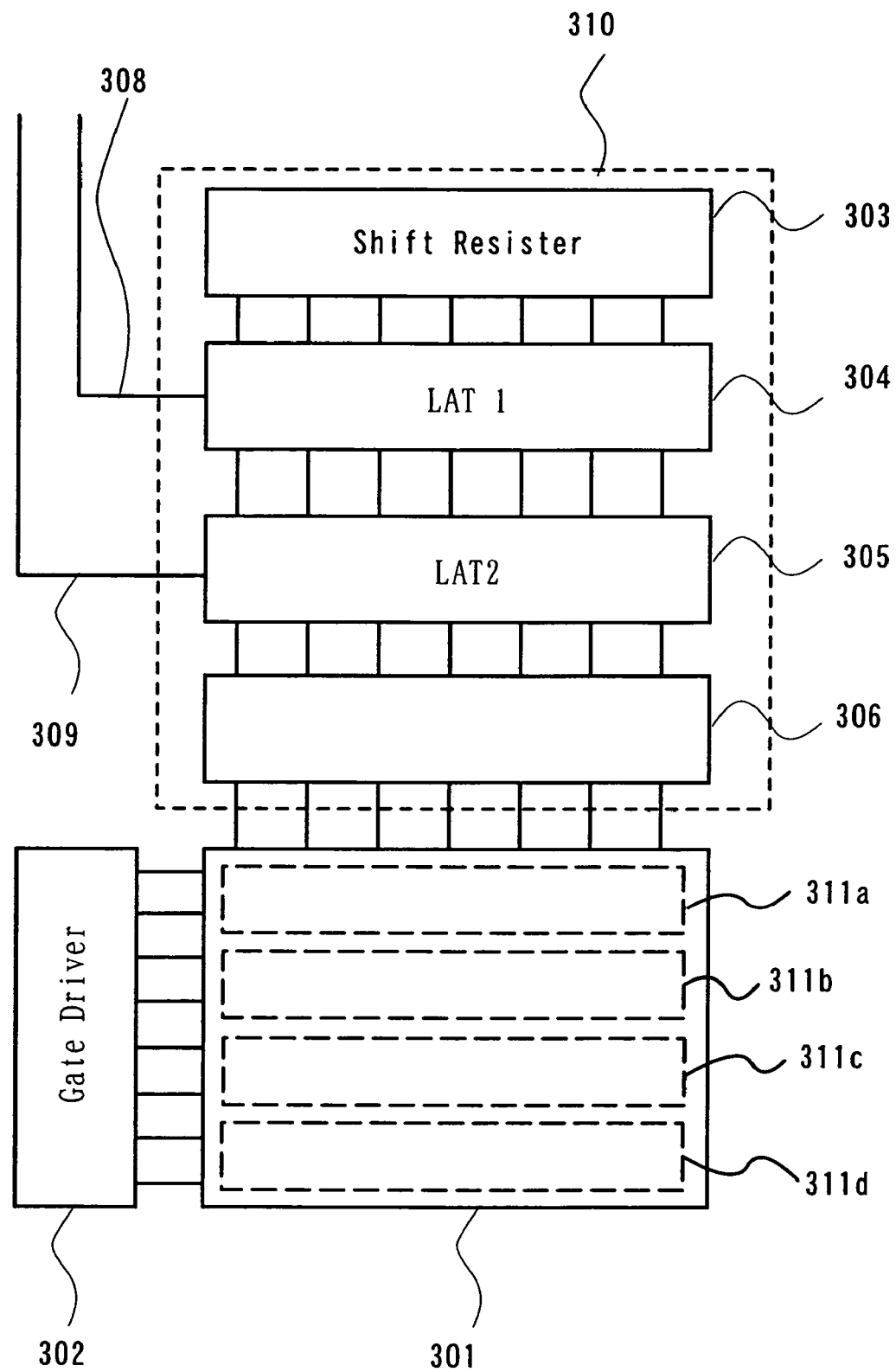
FIG. 3 illustrates a display device shown in Embodiment 1.

As shown in FIG. 3, the display device includes a pixel array 301, a scan line driver circuit (Gate Driver) 302 and a data line driver circuit 310. The scan line driver circuit 302 has an address decoding function, and outputs selection signals to the pixel array 301. In stead of using the decoder, the scan line driver circuit 302 may be constructed by using a shift register and a selector.

Additionally, the scan line driver circuit 302 is often provided with a buffer circuit, a level shifter, a pulse width control circuit and the like. The data line driver circuit 310 sequentially outputs video signals to the pixel array 301. A shift register 303 outputs pulses for sequentially selecting a first latch circuit (LAT1) 304. In the pixel array 301, images are displayed by controlling the light-emission state in accordance with video signals. Video signals inputted to the pixel array 301 from the data line driver circuit 310 are often voltage. That is, the states of a display element disposed in each pixel and an element for controlling the display element are changed with the video signals (voltage) inputted from the data line driver circuit 310. As an example of the display element disposed in each pixel of the pixel array 301, there is an EL element, an element used in an FED (Field Emission Display), liquid crystals, a DMD (Digital Micro-mirror Device) or the like. In the case of using the EL element as the display element disposed in the pixel, the pixels shown in FIG. 2 can be arranged in matrix in the pixel array 301.

Note that the multiple scan line driver circuits 302 and the multiple data line driver circuits 310 may be provided.

The configuration of the data line driver circuit 310 may be divided into several units. For example, the data line driver circuit 310 can be roughly divided into the shift register 303, the first latch circuit (LAT1) 304, a second latch circuit (LAT2) 305 and an amplifier circuit 306. The amplifier circuit 306 may have a function to convert digital signals to analog signals and a gamma correction function.

In addition, each pixel has a display element such as an EL element. In some cases, the display element is provided with a circuit for outputting a current (video signal) to the display element, namely a current source circuit.

Here, description is made briefly on the operation of the data line driver circuit 310. A clock signal (S-CLK), a start pulse (SP) and an inverted clock signal (S-CLKb) are inputted to the shift register 303. In accordance with the timing of these signals, sampling pulses are sequentially outputted.

The sampling pulses outputted from the shift register 303 are inputted to the first latch circuit (LAT 1) 304. The first latch circuit (LAT 1) 304 receives video signals from a video data line 308, and holds the video signals in each column in accordance with the input timing of the sampling pulses.

Upon completion of the video signal holding up to the last column of the first latch circuit (LAT 1) 304, a latch pulse is inputted thereto from a latch control line 309 during a horizontal flyback period, and then, the video signals held in the first latch circuit (LAT 1) 304 are transferred to the second latch circuit (LAT 2) 305 all at once. Subsequently, the video signals held in the second latch circuit (LAT 2) 305 are simultaneously inputted by one row to the amplifier circuit 306. Then, the signals outputted from the amplifier circuit 306 are inputted to the pixel array 301.

During the period in which the video signals held in the second latch circuit (LAT 2) 305 are inputted to the amplifier circuit 306 and then inputted to the pixel array 301, the shift register 303 outputs sampling pulses again. That is, two operations are performed simultaneously. Accordingly, line sequential driving can be performed. This operation is repeated hereinafter.

Note that there may be a case where the data line driver circuit or a part thereof (e.g., a current source circuit or an amplifier circuit) is not formed over the same substrate as the pixel array 301 but formed by using external IC chips, for example.

The pixel array 301 of the display device of the invention is composed of groups 311a, 311b, 311c and 311d each having multiple pixel rows.

In each of these groups 311a, 311b, 311c and 311d, the order of sub-frames is different from each other. Specifically, the order of the sub-frames may be set as shown in Embodiment Mode 1.

In the display device shown in this embodiment, the frame frequency can be suppressed low even when high-resolution display is performed; therefore, the power consumption can be reduced. In addition, since the high aperture ratio and the high duty ratio can be maintained, sufficient luminous intensity can be obtained even when the instantaneous luminance is low. Accordingly, the reliability of the display elements is excellent.

An electronic appliance having the display device of the invention as a display portion includes a camera (e.g., a video camera or a digital camera), a goggle display, a navigation system, an audio reproducing device (e.g., a car audio set or an audio component stereo), a computer, a game machine, a portable information terminal (e.g., a mobile computer, a portable phone, a portable game machine or an electronic book), an image reproducing device provided with a recording medium (specifically, a device for reproducing a recording medium such as a digital versatile disc (DVD) and having a display portion for displaying the reproduced image), and the like. FIGS. 4A to 4H illustrate specific examples of such an electronic appliance.

Figure 4A:
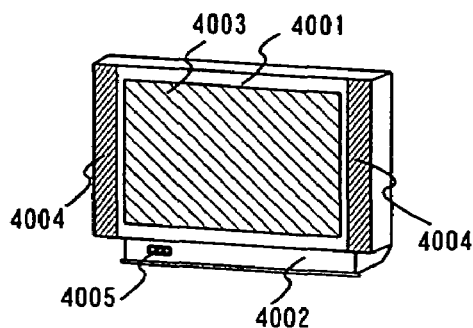
FIGS. 4A to 4H illustrate electronic appliances shown in Embodiment 1.

FIG. 4A shows a light-emitting device which includes a housing 4001, a supporting base 4002, a display portion 4003, speaker portions 4004, a video input terminal 4005 and the like. The invention can be applied to a display device for constituting the display portion 4003. According to the invention, high-resolution display can be achieved with low power consumption, and thus the light-emitting device shown in FIG. 4A can be completed. Note that the light-emitting device includes all information display devices for a personal computer, TV broadcast reception, advertising display and the like.

Figure 4B:
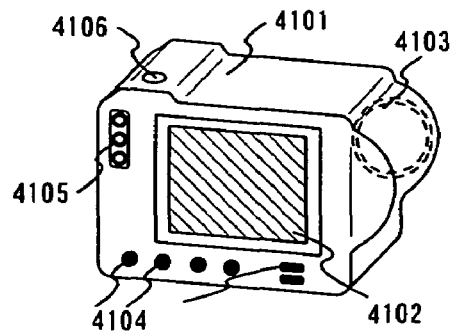

FIG. 4B shows a digital camera which includes a main body 4101, a display portion 4102, an image receiving portion 4103, operating keys 4104, an external connection port 4105, a shutter 4106 and the like. The invention can be applied to a display device for constituting the display portion 4102. According to the invention, high-resolution display can be achieved with low power consumption, and thus the digital camera shown in FIG. 4B can be completed.

Figure 4C:
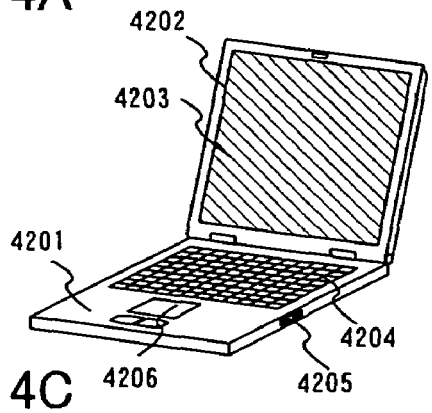

FIG. 4C shows a computer which includes a main body 4201, a housing 4202, a display portion 4203, a keyboard 4204, an external connection port 4205, a pointing mouse 4206 and the like. The invention can be applied to a display device for constituting the display portion 4203. According to the invention, high-resolution display can be achieved with low power consumption, and thus the computer shown in FIG. 4C can be completed.

Figure 4D:
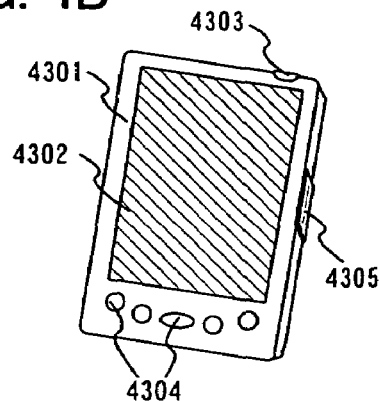

FIG. 4D shows a mobile computer which includes a main body 4301, a display portion 4302, a switch 4303, operating keys 4304, an IR port 4305 and the like. The invention can be applied to a display device for constituting the display portion 4302. According to the invention, high-resolution display can be achieved with low power consumption, and thus the mobile computer shown in FIG. 4D can be completed.

Figure 4E:
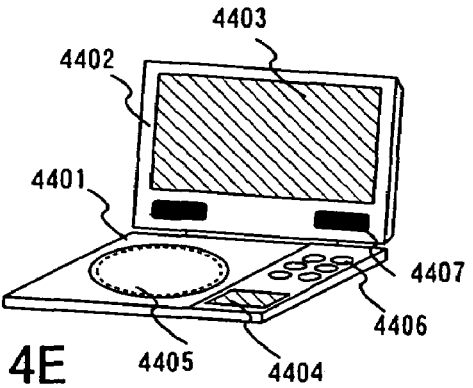

FIG. 4E shows a portable image reproducing device provided with a recording medium (specifically, a DVD reproducing device) which includes a main body 4401, a housing 4402, a display portion A4403, a display portion B4404, a recording medium (e.g., DVD) reading portion 4405, an operating key 4406, a speaker portion 4407 and the like. The display portion A4403 mainly displays image data while the display portion B4404 mainly displays text data. The invention can be applied to display devices for constituting the display portions A4403 and B4404. Note that the image reproducing device provided with a recording medium includes a home game machine and the like. According to the invention, high-resolution display can be achieved with low power consumption, and thus the DVD reproducing device shown in FIG. 4E can be completed.

Figure 4F:
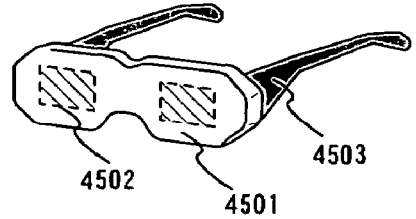

FIG. 4F shows a goggle display which includes a main body 4501, a display portion 4502 and an arm portion 4503. The invention can be applied to a display device for constituting the display portion 4502. According to the invention, high-resolution display can be achieved with low power consumption, and thus the goggle display shown in FIG. 4F can be completed.

Figure 4G:
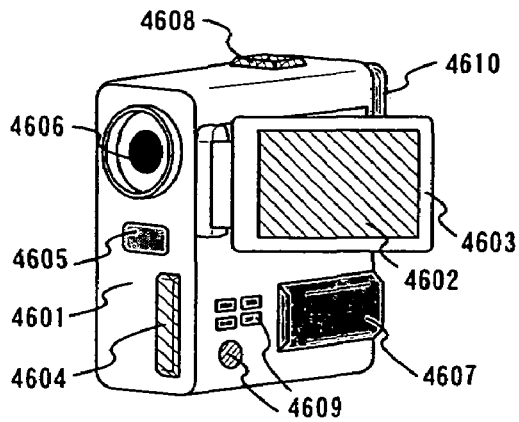

FIG. 4G shows a video camera which includes a main body 4601, a display portion 4602, a housing 4603, an external connection port 4604, a remote controller receiving portion 4605, an image receiving portion 4606, a battery 4607, an audio input potion 4608, operating keys 4609, an eyepiece portion 4610 and the like. The invention can be applied to a display device for constituting the display portion 4602. According to the invention, high-resolution display can be achieved with low power consumption, and thus the video camera shown in FIG. 4G can be completed.

Figure 4H:
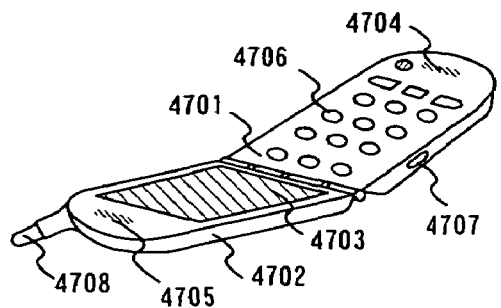

FIG. 4H shows a portable phone which includes a main body 4701, a housing 4702, a display portion 4703, an audio input portion 4704, an audio output portion 4705, an operating key 4706, an external connection port 4707, an antenna 4708 and the like. The invention can be applied to a display device for constituting the display portion 4703. According to the invention, high-resolution display can be achieved with low power consumption, and thus the portable phone shown in FIG. 4H can be completed.

Note that in the case of using a light-emitting element as a display element, if the high luminance of a light-emitting material becomes available in the future, the invention can be applied to a front or rear projector by projecting the output light containing image data through magnification with a lens and the like.

In the aforementioned electronic appliances, data distributed through telecommunication lines such as the Internet or CATV (cable television) is more often displayed nowadays, and in particular, more moving image data is displayed. In the case of using a light-emitting element as a display element, high response speed of the light-emitting material can be obtained; therefore, the light-emitting device is preferable for displaying moving images.

In addition, in the case of using a light-emitting element as a display element, data is desirably displayed by utilizing as small a light-emitting portion as possible since the light-emitting portion consumes power in the light-emitting device. Accordingly, in the case where the light-emitting device is applied to a display portion which mainly displays text data in a portable information terminal, in particular, such as a portable phone or an audio reproducing device, the light-emitting device is desirably driven in such a manner that text data is formed by a light-emitting portion on a non-light-emitting portion as the background.

As set forth above, the applicable range of the invention is so wide that the invention can be applied to electronic appliances in various fields.

EMBODIMENT 2

Description is made with reference to the drawings on one configuration example of a display device described in Embodiment 1.

Figure 5:
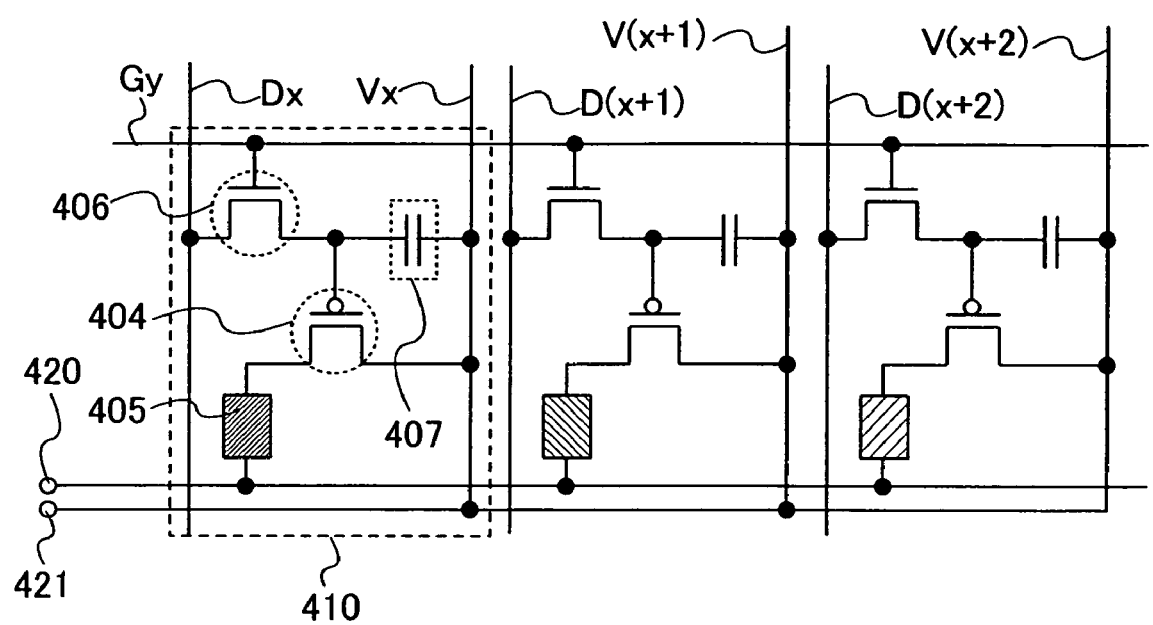
FIG. 5 illustrates an example of a pixel circuit applicable to the display device of the invention.

A pixel 410 shown in FIG. 5 has a configuration where two transistors are provided. The pixel 410 is provided in a region where a data line Dx (x is a natural number, $1 \leq x \leq m$) intersects a scan line Gy (y is a natural number, $1 \leq y \leq n$) with an insulating layer interposed therebetween. The pixel 410 includes an EL element 405, a capacitor 407, a switching transistor 406 and a driving transistor 404. The switching transistor 406 controls a video signal input while the driving transistor 404 controls the light-emission and non-light-emission of the EL element 405. These transistors are field effect transistors, and for example, thin film transistors may be employed.

A gate of the switching transistor 406 is connected to the scan line Gy and one of a source and drain thereof is connected to the data line Dx while the other is connected to a gate of the driving transistor 404. One of a source and drain of the driving transistor 404 is connected to a second power source line 421 through a power source line Vx (x is a natural number, $1 \leq x \leq m$) while the other is connected to the EL element 405. An end of the EL element 405 which is not connected to the first power source line 420 is connected to the second power source line 421 through the driving transistor 404.

The capacitor 407 is provided between the gate and source or drain of the driving transistor 404. The switching transistor 406 and the driving transistor 404 may be either n-channel transistors or p-channel transistors. In the pixel 410 shown in FIG. 5, the switching transistor 406 is an n-channel transistor while the driving transistor 404 is a p-channel transistor.

Potentials of the first power source line 420 and the second power source line 421 are not specifically limited, but they are set to be different potentials from each other so that a forward voltage or a reverse voltage is applied to the EL element 405.

By providing the EL element 405 in each pixel 410 to have a different light-emission color, color display can be performed. The light-emission colors may be a combination of the three colors of red, green and blue as well as the four colors of red, green, blue and emerald green. In addition, orange may be added thereto. In this manner, by increasing the light-emission color, color reproducibility can be improved. In addition, a pixel including an EL element which emits white light may be combined. Accordingly, image quality can be improved.

Figure 6:
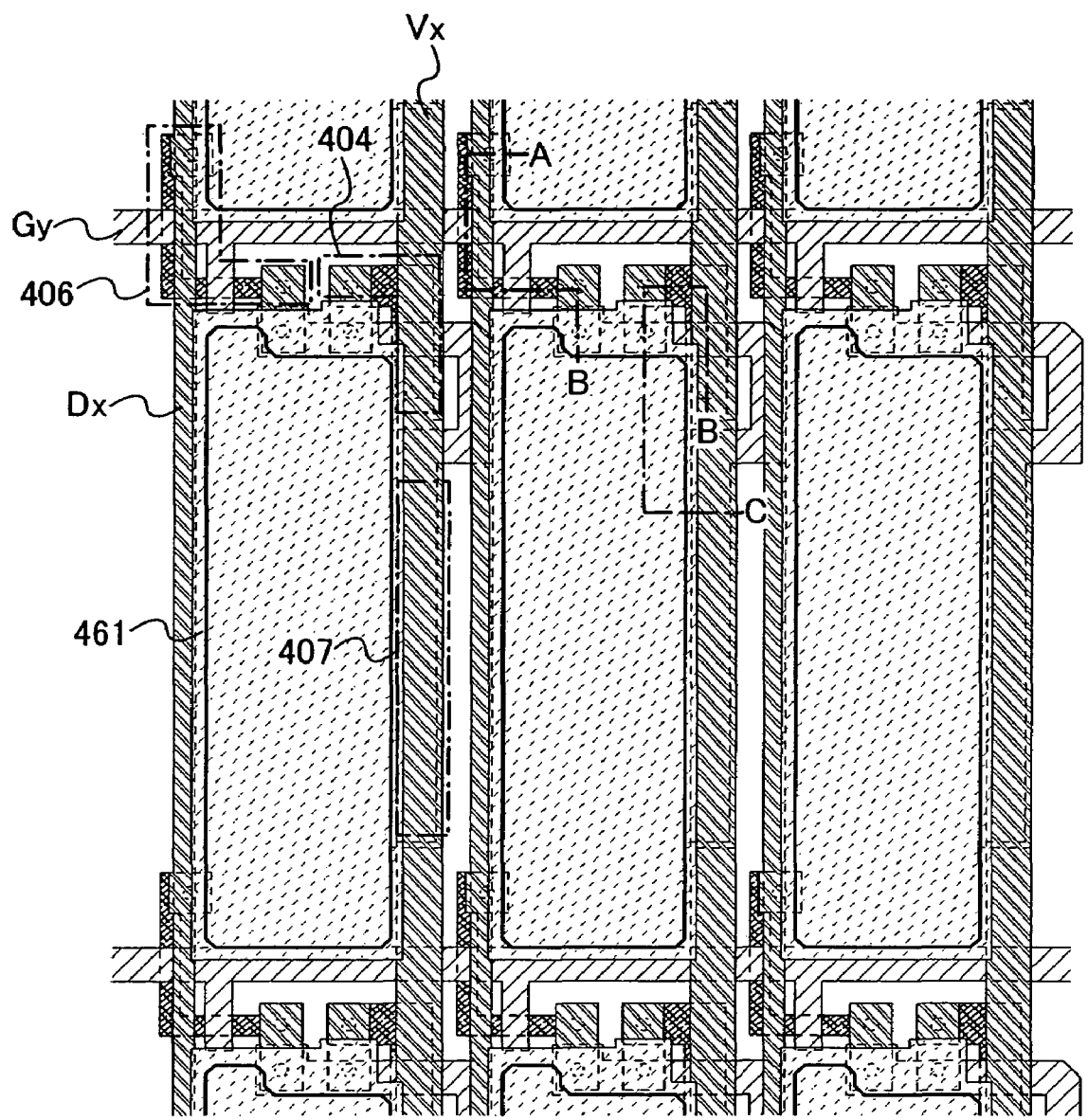
FIG. 6 is a plan view illustrating an example of a pixel applicable to the display device of the invention.

FIG. 6 is a plan view of the pixel 410. The switching transistor 406, the driving transistor 404 and the capacitor 407 are disposed. A first electrode 461 is one of the two electrodes of the EL element 405. By forming a light-emitting layer over the first electrode 461, the EL element 405 connected to the driving transistor 404 is formed. The capacitor 407 is provided to overlap the power source line Vx in order to increase the aperture ratio.

Figure 7:
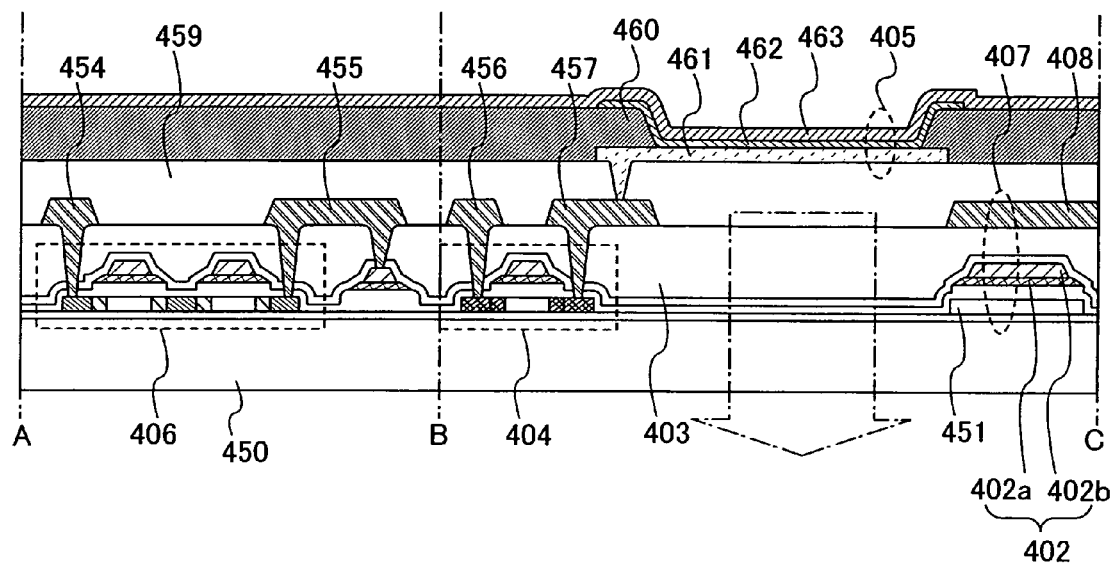
FIG. 7 is a cross-sectional view illustrating an example of a pixel applicable to the display device of the invention.

FIG. 7 shows a cross-sectional structure along a section line A-B-C shown in FIG. 6. Over a substrate 450 having an insulating surface such as glass or quartz, the switching transistor 406, the driving transistor 404, the EL element 405 and the capacitor 407 are provided. The switching transistor 406 is preferably a multi-gate transistor in order to reduce the off current. Various semiconductors may be applied to the semiconductor for forming a channel portion of each of the switching transistor 406 and the driving transistor 404. For example, an amorphous semiconductor containing silicon as a main component, a semi-amorphous semiconductor (also referred to as a micro-crystalline semiconductor) or a polycrystalline semiconductor may be used. Alternatively, an organic semiconductor may be used. The semi-amorphous semiconductor is formed using a silane gas ($SiH_4$) and a fluorine gas ($F_2$) or using a silane gas and a hydrogen gas. In addition, a polycrystalline semiconductor may be used which is obtained by crystallizing an amorphous semiconductor formed by a physical vapor deposition method such as sputtering or a chemical vapor deposition method such as vapor phase growth by irradiation with electromagnetic energy such as a laser beam. Each gate of the switching transistor 406 and the driving transistor 404 preferably has a stacked-layer structure of tungsten nitride (WN) and tungsten (W), a stacked-layer structure of molybdenum (Mo), aluminum (Al) and Mo, or a stacked-layer structure of molybdenum nitride (MoN) and Mo in this order from the substrate side Wires 454, 455, 456 and 457 connected to sources or drains of the switching transistor 406 and the driving transistor 404 are each formed in a single layer or stacked layers using a conductive material. For example, a stacked-layer structure of titanium (Ti), silicon aluminum (Al—Si) and Ti in this order, a stacked-layer structure of Mo, Al—Si and Mo in this order, or a stacked-layer structure of MoN, Al—Si and MoN in this order may be employed. Note that such wires 454, 455, 456 and 457 are formed over a first insulating layer 403.

The EL element 405 has a stacked-layer structure of the first electrode 461 corresponding to the pixel electrode, a light-emitting layer 462 and a second electrode 463 corresponding to a counter electrode. Ends of the first electrode 461 are covered with a partition layer 460. The light-emitting layer 462 and the second electrode 463 are stacked so as to overlap the first electrode 461 in an opening of the partition layer 460. The overlapped portion corresponds to the EL element 405. In the case where both the first electrode 461 and the second electrode 463 transmit light, the EL element 405 emits light in the direction of the first electrode 461 and the direction of the second electrode 463. That is, the EL element 405 emits light to both the top and bottom sides. Alternatively, in the case where one of the first electrode 461 and the second electrode 463 transmits light while the other blocks light, the EL element 405 emits light in the direction of the first electrode 461 or the direction of the second electrode 463. That is, the EL element 405 emits light to the top side or the bottom side.

FIG. 7 shows an example of a cross-sectional structure in the case where the EL element 405 emits light to the bottom side. The capacitor 407 is disposed between the gate and source of the driving transistor 404, and holds the gate-source voltage. The capacitor 407 forms capacitance by a semiconductor layer 451 provided in the same layer as semiconductor layers for forming the switching transistor 406 and the driving transistor 404, conductive layers 402a and 402b (hereinafter collectively referred to as a conductive layer 402) provided in the same layer as the gates of the switching transistor 406 and the driving transistor 404, and an insulating layer interposed therebetween.

The capacitor 407 also forms capacitance by the conductive layer 402 provided in the same layer as the gates of the switching transistor 406 and the driving transistor 404, a wire 458 provided in the same layer as the wires 454, 455, 456 and 457 connected to the sources or drains of the switching transistor 406 and the driving transistor 404, and an insulating layer interposed therebetween. Accordingly, the capacitor 407 can have high capacity enough to hold the gate-source voltage of the driving transistor 404. In addition, by forming the capacitor 407 to overlap a conductive layer for forming the power source line Vx, decrease in the aperture ratio due to the provision of the capacitor 407 is suppressed.

Each thickness of the wires 454, 455, 456 and 457 connected to the sources or drains of the switching transistor 406 and the driving transistor 404, and the wire 458 is 500 to 2000 nm, or preferably 500 to 1300 nm. The wires 454, 455, 456, 457 and 458 constitute the data line Dx or the power source line Vx; therefore, by forming the wires 454, 455, 456, 457 and 458 to be thick in such a manner, an effect of a voltage drop can be suppressed.

The first insulating layer 403 and a second insulating layer 459 are formed using inorganic materials such as silicon oxide or silicon nitride, organic materials such as polyimide or acrylic, and the like. The first insulating layer 403 and the second insulating layer 459 may be formed using the same material or different materials. As the organic material, a siloxane-based resin may be used. Siloxane is composed of a skeleton formed by the bond of silicon (Si) and oxygen (O), and has an organic group containing at least hydrogen (e.g., an alkyl group or an aromatic hydrocarbon) as a substituent. Alternatively, a fluoro group may be used as the substituent. Further alternatively, a fluoro group and an organic group containing at least hydrogen may be used as the substituent.

Such a structure of the pixel array can be applied to the pixel array 301 in Embodiment 1 which is shown in FIG. 3.

EMBODIMENT 3

Description is made on a panel corresponding to one mode of a display device of the invention, on which a pixel array 411, a scan line driver circuit 408 and a data line driver circuit 409 are mounted. Over the substrate 450, the pixel array 411 having multiple pixels each including the EL element 405, the scan line driver circuit 408, the data line driver circuit 409 and a connection film 467 are provided (see FIG. 8A). The connection film 467 is connected to an external circuit.

Figure 8A:
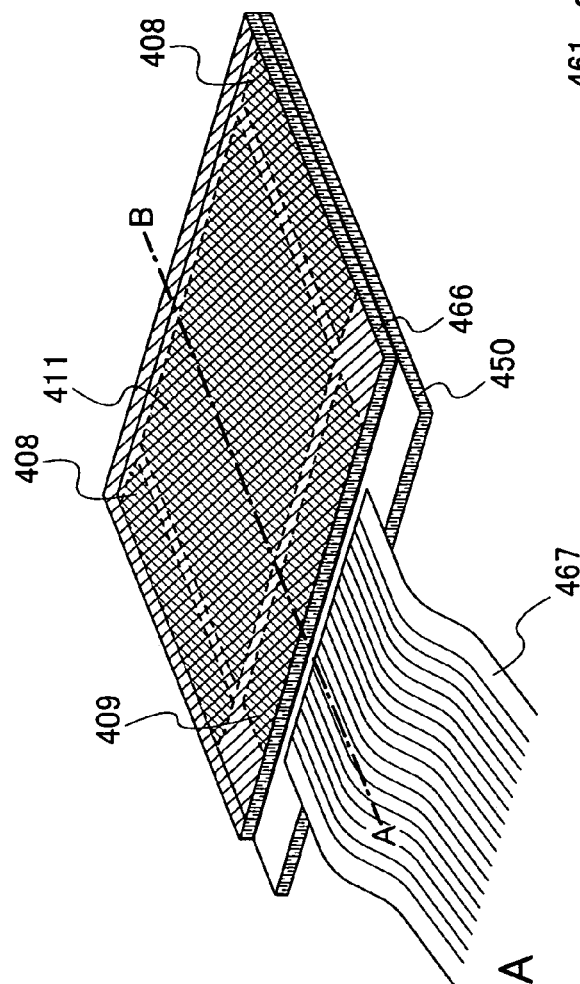
FIGS. 8A and 8B illustrate structures of a panel in accordance with the invention.
Figure 8B:
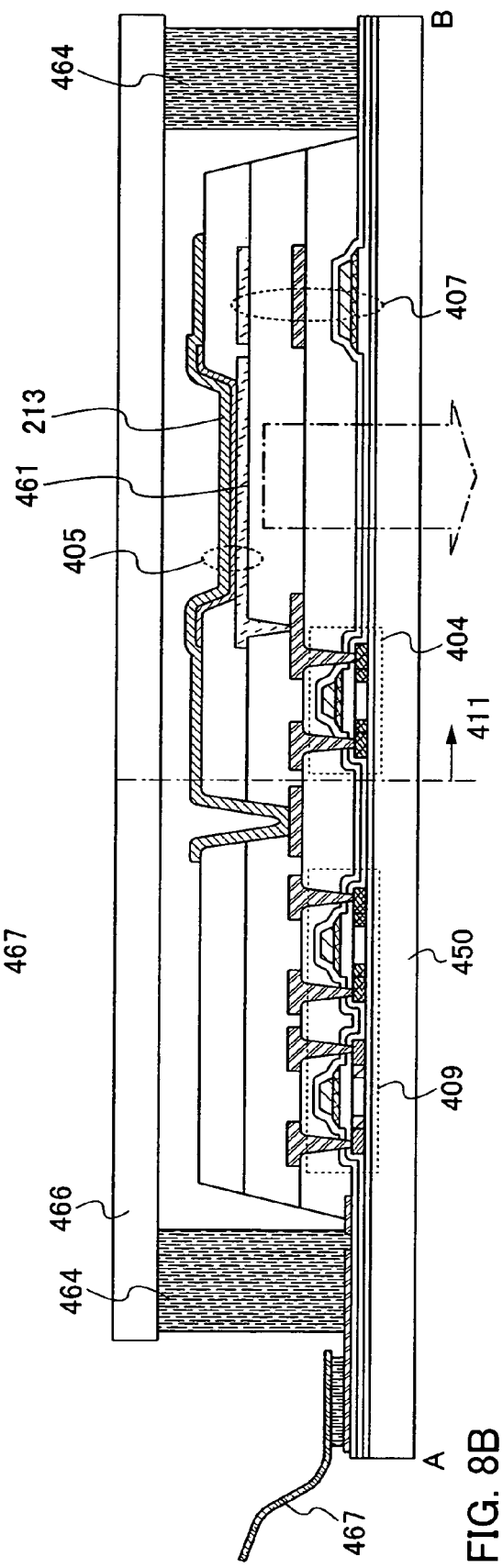

FIG. 8B is a cross-sectional view along a line A-B of the panel in FIG. 8A, which shows the driving transistor 404, the EL element 405 and the capacitor 407 provided in the pixel array 411 and transistors provided in the data line driver circuit 409. A sealant 464 is provided around the pixel array 411, the scan line driver circuit 408 and the data line driver circuit 409, and the EL element 405 is sealed with the sealant 464 and a counter substrate 466. This sealing process is performed to protect the EL element 405 from moisture, and here, a covering material (glass, ceramics, plastics, metals or the like) is used for sealing; however, alternatively, a method for sealing with a heat curable resin or an ultraviolet curable resin or a method for sealing with a thin film having a high barrier property such as a metal oxide or a metal nitride may be used. Elements formed over the substrate 450 are preferably formed using crystalline semiconductors (polysilicon) having excellent properties such as mobility as compared to the amorphous semiconductor, thereby monolithic integration over the same substrate can be realized. The panel having such a structure has a smaller number of external ICs to be connected; therefore, downsizing, weight saving and thin shape can be realized.

Note that in the aforementioned structure shown in FIGS. 8A and 8B, the first electrode 461 of the EL element 405 transmits light while the second electrode 463 thereof blocks light. Accordingly, the EL element 405 emits light to the substrate 450 side. Alternatively, as shown in FIG. 9A, a different structure may be employed such that the first electrode 461 of the EL element 405 blocks light while the second electrode 463 thereof transmits light. In this case, the EL element 405 emits light to the top side. Further alternatively, as shown in FIG. 9B, still a different structure may be employed such that both the first electrode 461 and the second electrode 463 of the EL element 405 transmit light so that light is emitted to both sides.

Note that the pixel array 411 may be constituted by transistors of which channel portions are formed using amorphous semiconductors (amorphous silicon) formed over an insulating surface, and the scan line driver circuit 408 and the data line driver circuit 409 may be constituted by driver ICs. The driver ICs may be mounted on the substrate 450 by a COG bonding method or mounted on the connection film 467 connected to the substrate 450. The amorphous semiconductor can easily be formed over a large-area substrate by using a CVD method without requiring a crystallization step; therefore, an inexpensive panel can be provided. At this time, by forming a conductive layer by a droplet discharge method typified by an inkjet deposition method, a more inexpensive panel can be provided.

Such a structure of the pixel array can be applied to the pixel array 301 in Embodiment 1 which is shown in FIG. 3.

EMBODIMENT 4

Figure 10A:
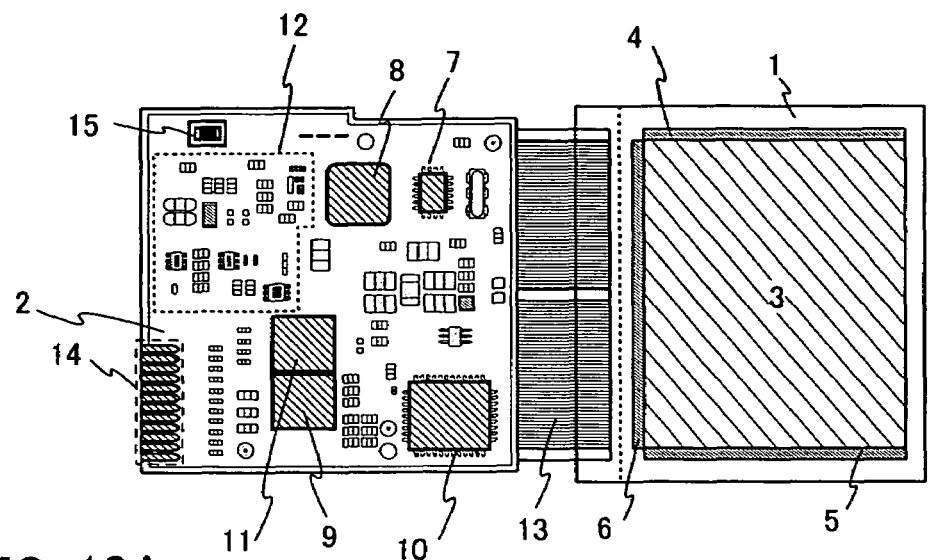
FIGS. 10A and 10B illustrate a configuration example of a module in accordance with the invention.

FIG. 10A illustrates a module in which a panel 1 and a printed wiring board 2 are combined. The panel 1 includes a pixel array 3 where an EL element is provided in each pixel, a first scan line driver circuit 4, a second scan line driver circuit 5, and a data line selection driver circuit 6 for supplying a video signal to a selected pixel. This configuration is similar to that in Embodiment 1.

The printed wiring board 2 includes a display controller 7, a central processing unit (CPU) 8, a memory 9, a power source circuit 10, an audio processing circuit 11, a transmission/reception circuit 12, and the like. The printed wiring board 2 is connected to the panel 1 through a flexible wiring board (FPC) 13. The printed wiring board 2 may have a configuration where a capacitor, a buffer circuit and the like are provided in order to prevent that a power source voltage and signals are interrupted by noise or the signal rising is slowed. In addition, the controller 7, the audio processing circuit 11, the memory 9, the CPU 8, the power source circuit 10 and the like can be mounted on the panel 1 by using a COG (Chip on Glass) bonding method. By the COG bonding method, the scale of the printed wiring board 2 can be reduced.

Various control signals such as an input means 25 (e.g., key switch or stylus pen) are inputted and outputted through an interface portion 14 (I/F portion 14) provided on the printed wiring board 2. In addition, an antenna port 15 for transmitting/receiving signals to/from an antenna is provided on the printed wiring board 2.

Figure 10B:
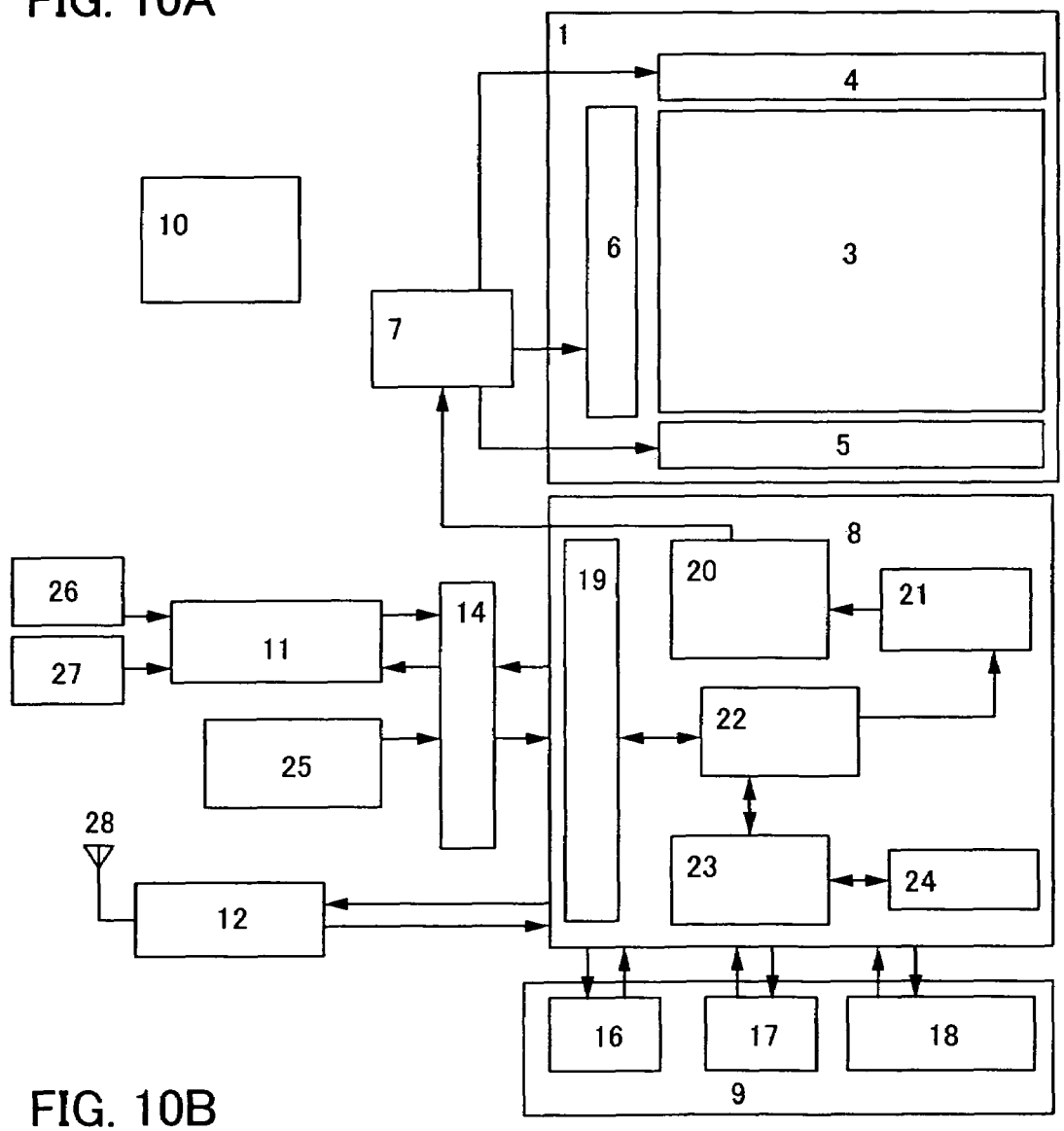

FIG. 10B is a block diagram of the module shown in FIG. 10A. This module includes a VRAM 16, a DRAM 17, a flash memory 18 and the like as the memory 9. The VRAM 16 stores image data to be displayed on the panel, the DRAM 17 stores image data or audio data, and the flash memory 18 stores various programs.

The power source circuit 10 supplies power for operating the panel 1, the display controller 7, the CPU 8, the audio processing circuit 11, the memory 9 and the transmission/reception circuit 12. Depending on the specification of the panel, there may be a case where the power source circuit 10 is provided with a current source.

The CPU 8 includes a control signal generating circuit 20, a decoder 21, a register 22, an arithmetic circuit 23, a RAM 24, and an interface 19 for the CPU 8. Each signal inputted to the CPU 8 through the interface 19 is once stored in the register 22, and then it is inputted to the arithmetic circuit 23, the decoder 21 and the like. In the arithmetic circuit 23, arithmetic operation is performed based on the inputted signal, and an address for sending each instruction is specified. Meanwhile, the signal inputted to the decoder 21 is decoded, and then inputted to the control signal generating circuit 20. The control signal generating circuit 20 generates a signal containing each instruction based on the inputted signal, and transmits the signal to the address specified by the arithmetic circuit 23, specifically such as the memory 9, the transmission/reception circuit 12, the audio processing circuit 11 and the display controller 7.

The transmission/reception circuit 12 processes a signal which is transmitted/received as a radio wave in an antenna 28, and specifically, it includes a high-frequency circuit such as an isolator, a bandpass filter, a VCO (Voltage Controlled Oscillator), an LPF (Low Pass Filter), a coupler or a balun. Among signals transmitted/received to/from the transmission/reception circuit 12, a signal containing audio data is transmitted to the audio processing circuit 11 in accordance with the instruction from the CPU 8.

The signal containing the audio data transmitted in accordance with the instruction from the CPU 8 is demodulated into an audio signal in the audio processing circuit 11, and then transmitted to a speaker 27. An audio signal transmitted from a microphone 26 is modulated in the audio processing circuit 11, and then transmitted to the transmission/reception circuit 12 in accordance with the instruction from the CPU 8.

The display controller 7, the CPU 8, the power source circuit 10, the audio processing circuit 11 and the memory 9 may be mounted as a package of this embodiment. This embodiment can be applied to any circuits other than the high-frequency circuit such as an isolator, a bandpass filter, a VCO (Voltage Controlled Oscillator), an LPF (Low Pass Filter), a coupler and a balun.

In the module of this embodiment, the order of sub-frames can be changed in each group of the pixel array by the display controller.

EMBODIMENT 5

This embodiment illustrates an example where a portable phone 90 is completed using the panel described in Embodiment 4.

Figure 11:
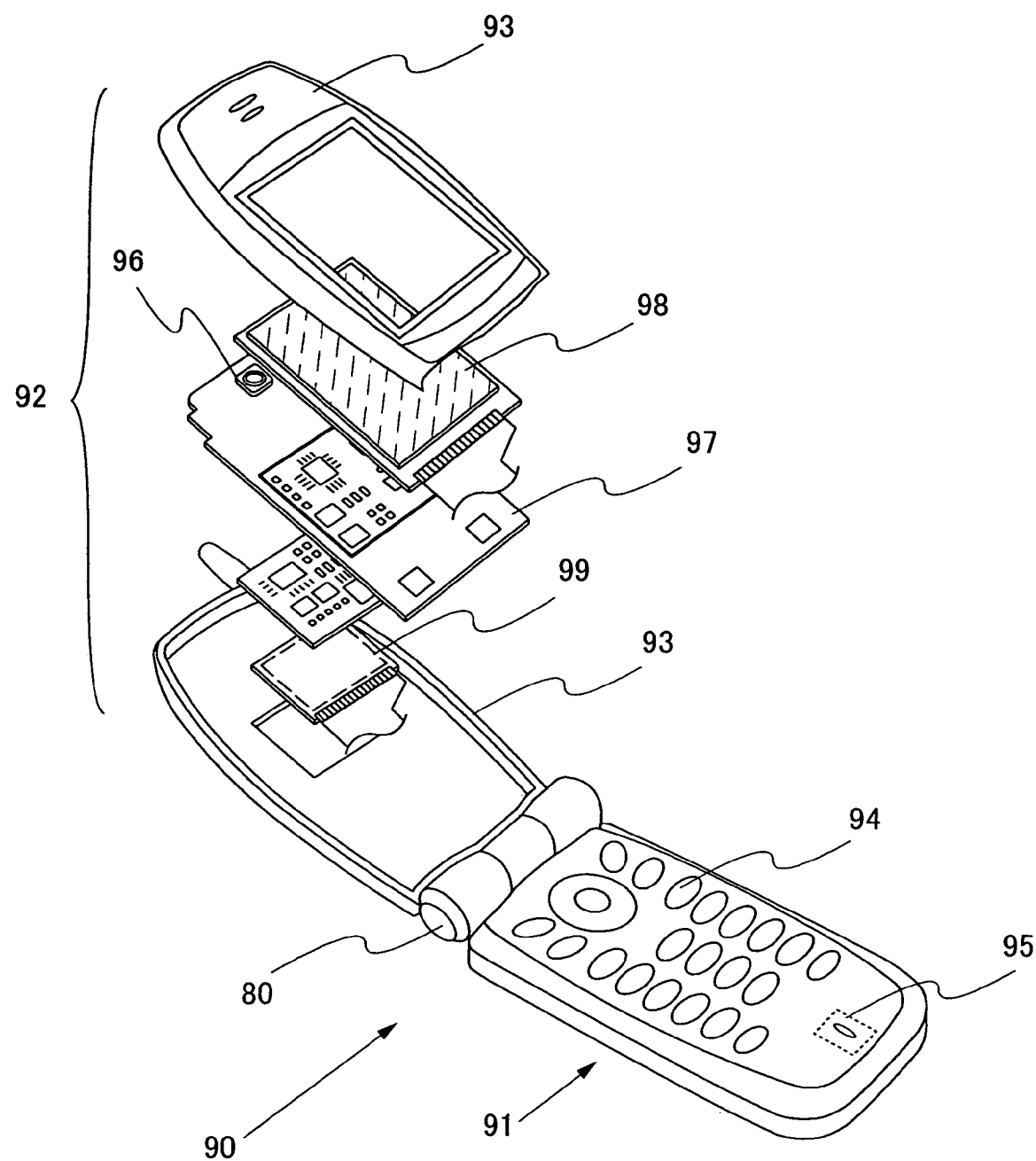
FIG. 11 illustrates a configuration example of a portable phone in accordance with the invention.

In the portable phone 90 shown in FIG. 11, a main body (A) 91 provided with an operating switch 94, a microphone 95 and the like is connected to a main body (B) 92 provided with a display panel (A) 98, a display panel (B) 99, a speaker 96 and the like with a hinge 80 so that the portable phone 90 can be opened or folded. The display panel (A) 98 and the display panel (B) 99 are incorporated into housings 93 of the main body (B) 92 together with a circuit board 97. Pixel arrays of the display panel (A) 98 and the display panel (B) 99 are disposed so that they can be seen from open windows formed in the housings 93.

The specifications of the display panel (A) 98 and the display panel (B) 99 such as the number of pixels can be set appropriately in accordance with the function of the portable phone 90. For example, the display panel (A) 98 and the display panel (B) 99 can be combined so as to be used as a main display screen and a sub-display screen respectively.

The display panel (A) 98 can be used as a display screen for high-resolution color display to display images or text while the display panel (B) 99 can be used as a display screen for monochromatic data display to display text data. In particular, when the display panel (B) 99 is formed as an active matrix panel to achieve high resolution, the data display density per image screen can be improved by displaying various text data. For example, by forming the display panel (A) 98 to have a size of 2 to 2.5 inches where 64 gray scales are expressed with 260,000 colors in QVGA (320 dots×240 dots), and forming the display panel (B) 99 as a high-resolution panel where 2 to 8 gray scales are expressed with 180 to 220 ppi in monochrome, Roman characters, hiragana, katakana, Chinese characters, Arabic characters and the like can be displayed.

By mounting the module shown in Embodiment 4 on the portable phone, low power consumption can be achieved. Accordingly, even in the case where a tuner is incorporated into the module to receive terrestrial digital broadcasting, moving images can be displayed for a long time, and image quality can be improved.

The portable phone in this embodiment can be changed into various modes in accordance with the function or applications. For example, by incorporating an image pick-up device into a portion of the hinge 80, a portable phone equipped with a camera can be provided. In addition, if the operating switch 94, the display panel (A) 98 and the display panel (B) 99 are incorporated into one housing, the aforementioned effect can be obtained. Further, if the structure of this embodiment is applied to an information display terminal having multiple display portions, a similar effect can be obtained.

The present application is based on Japanese Priority application No. 2004-353454 filed on Dec. 6, 2004 with the Japanese Patent Office, the entire contents of which are hereby incorporated by reference.

What is claimed is:

1. A display device for expressing gray scales by dividing one frame into a plurality of sub-frames, comprising:

a pixel array having a plurality of pixels arranged in matrix,
wherein the pixel array is divided into a plurality of groups,
wherein the order of the plurality of the sub-frames is different in each of the plurality of the groups, and
wherein a time required for scanning all of the plurality of the groups is longer than a data holding period of a sub-frame corresponding to the least significant bit.

2. The display device according to claim 1, wherein each of the plurality of groups comprises pixels arranged in a row.

3. The display device according to claim 1, wherein each of the plurality of pixels comprise at least one thin film transistor.

4. The display device according to claim 1, wherein an EL element is used as a display element in each pixel.

5. The display device according to claim 1, further comprising a scan line driver circuit and a data line driver circuit.

6. The display device according to claim 5, wherein the scan line driver circuit comprises a decoder.

7. The display device according to claim 5, wherein the scan line driver circuit comprises a shift register and a selector.

8. An electronic appliance having the display device according to claim 1 as a display portion.

9. A driving method of a display device comprising a pixel array having a plurality of pixel rows, for expressing gray scales, comprising the step of:
dividing one frame into a plurality of sub-frames, and ordering the plurality of the sub-frames,
wherein the plurality of the pixel rows is divided into a plurality of groups,
wherein the ordering is different in each of the plurality of the groups, and
wherein a time required for scanning the plurality of pixel rows is longer than a data holding period of a sub-frame corresponding to the least significant bit.

10. The driving method of the display device according to claim 9, wherein each of the plurality of groups comprises pixels arranged in a row.

11. The driving method of the display device according to claim 9, wherein each of the plurality of pixels comprise at least one thin film transistor.

12. The driving method of the display device according to claim 9, wherein an EL element is used as a display element in each pixel.

13. The driving method of the display device according to claim 9, wherein the display device further comprising a scan line driver circuit and a data line driver circuit.

14. The driving method of the display device according to claim 13, wherein the scan line driver circuit comprises a decoder.

15. The driving method of the display device according to claim 13, wherein the scan line driver circuit comprises a shift register and a selector.

16. The driving method of an electronic appliance having the display device according to claim 9 as a display portion.

17. A driving method of a display device comprising a pixel array having a plurality of pixel rows, for expressing gray scales, comprising the step of:
dividing one frame into a plurality of sub-frames, and ordering the plurality of the sub-frames,
wherein the plurality of the pixel rows is divided into a plurality of groups,
wherein the ordering is different in each of the plurality of the groups,
wherein a time required for scanning the plurality of pixel rows is longer than a data holding period of a sub-frame corresponding to the least significant bit, and
wherein a data writing period of each group is shorter than a data holding period of a sub-frame corresponding to the least significant bit.

18. The driving method of the display device according to claim 17, wherein each of the plurality of groups comprises pixels arranged in a row.

19. The driving method of the display device according to claim 17, wherein each of the plurality of pixels comprise at least one thin film transistor.

20. The driving method of the display device according to claim 17, wherein an EL element is used as a display element in each pixel.

21. The driving method of the display device according to claim 17, wherein the display device further comprising a scan line driver circuit and a data line driver circuit.

22. The driving method of the display device according to claim 21, wherein the scan line driver circuit comprises a decoder.

23. The driving method of the display device according to claim 21, wherein the scan line driver circuit comprises a shift register and a selector.

24. The driving method of an electronic appliance having the display device according to claim 17 as a display portion.

25. A driving method of a display device comprising a pixel array of x columns and y rows, for expressing gray scales, comprising the step of:
dividing one frame into a plurality of sub-frames, and ordering the plurality of the sub-frames,
wherein the plurality of the pixel rows is divided into j groups,
wherein the ordering is different in each of the j groups,
wherein a time required for scanning the plurality of pixel rows is longer than a data holding period of a sub-frame corresponding to the least significant bit,
wherein a formula $Twrite \times y/j = Thold$ is satisfied,
wherein Twrite is the time required for the data writing to one pixel row, and
wherein Thold is a data holding period of a sub-frame corresponding to the least significant bit.

26. The driving method of a display device according to claim 25, wherein the pixel rows belonging to the same group are scanned in time sequence for signal writing while pixel rows belonging to the other groups are all in the data holding period.

27. The driving method of the display device according to claim 25, wherein each of the plurality of groups comprises pixels arranged in a row.

28. The driving method of the display device according to claim 25, wherein each of the plurality of pixels comprise at least one thin film transistor.

29. The driving method of the display device according to claim 25, wherein an EL element is used as a display element in each pixel.

30. The driving method of the display device according to claim 25, wherein the display device further comprising a scan line driver circuit and a data line driver circuit.

31. The driving method of the display device according to claim 30, wherein the scan line driver circuit comprises a decoder.

32. The driving method of the display device according to claim 30, wherein the scan line driver circuit comprises a shift register and a selector.

33. The driving method of an electronic appliance having the display device according to claim 25 as a display portion.

* * * * *

UNITED STATES PATENT AND TRADEMARK OFFICE
CERTIFICATE OF CORRECTION

PATENT NO. : 7,502,040 B2  
APPLICATION NO. : 11/288696  
DATED : March 10, 2009  
INVENTOR(S) : Kawae et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 741 days.

Signed and Sealed this
Fifteenth Day of March, 2011

David J. Kappos
*Director of the United States Patent and Trademark Office*